United States Patent
Kuwazawa et al.

(10) Patent No.: US 10,020,333 B2
(45) Date of Patent: Jul. 10, 2018

(54) SOLID-STATE IMAGING DEVICE

(71) Applicant: SEIKO EPSON CORPORATION, Tokyo (JP)

(72) Inventors: Kazunobu Kuwazawa, Sakata (JP); Noriyuki Nakamura, Sakata (JP); Mitsuo Sekisawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/581,812

(22) Filed: Apr. 28, 2017

(65) Prior Publication Data

US 2017/0330904 A1 Nov. 16, 2017

(30) Foreign Application Priority Data

May 10, 2016 (JP) ................................ 2016-094610

(51) Int. Cl.
*H01L 31/062* (2012.01)
*H01L 27/146* (2006.01)

(52) U.S. Cl.
CPC .... *H01L 27/1461* (2013.01); *H01L 27/14643* (2013.01)

(58) Field of Classification Search
CPC .............. H01L 27/1461; H01L 27/14643
USPC .................. 257/229, 233, 292, 293
See application file for complete search history.

(56) References Cited

U.S. PATENT DOCUMENTS

| | | | |
|---|---|---|---|
| 5,955,753 | A | 9/1999 | Takahashi |
| 2006/0001751 | A1 | 1/2006 | Abe et al. |
| 2009/0053848 | A1* | 2/2009 | Fan ................. H01L 27/14603 438/59 |
| 2010/0171854 | A1 | 7/2010 | Yokogawa |
| 2013/0069119 | A1 | 3/2013 | Sekine |
| 2015/0319392 | A1* | 11/2015 | Kido ................. H01L 27/14603 250/208.1 |

FOREIGN PATENT DOCUMENTS

| | | |
|---|---|---|
| JP | 3031606 B2 | 4/2000 |
| JP | 3988189 B2 | 10/2007 |
| JP | 2010-161200 A | 7/2010 |
| JP | 2013-065652 A | 4/2013 |
| JP | 2014-060453 A | 4/2014 |

* cited by examiner

*Primary Examiner* — Tan N Tran
(74) *Attorney, Agent, or Firm* — Oliff PLC

(57) ABSTRACT

In this solid-state imaging device, the sameness of the potential distributions in pixels, in a region from a photodiode of a transfer transistor to a floating diffusion in a charge transfer path, is improved. The solid-state imaging device includes a first transfer transistor including a first photodiode, a first gate electrode, and a first floating diffusion, a second transfer transistor including a second photodiode, a second gate electrode, and a second floating diffusion, a third transfer transistor including a third photodiode, a third gate electrode, and a third floating diffusion, and a reset transistor including a diffusion layer, which is a source or drain region, and a reset gate. The first to third floating diffusions and the diffusion layer of the reset transistor are separated from each other, and are electrically connected to each other via an interconnect. The first to third photodiodes are arrayed one-dimensionally.

12 Claims, 3 Drawing Sheets

SOLID-STATE IMAGING DEVICE

BACKGROUND

1. Technical Field

The present invention relates to a solid-state imaging device.

2. Related Art

A pixel of a CMOS line sensor includes a photodiode (PD), a transfer transistor (TX), an amplification transistor (Amp), and a reset transistor (RST) as basic constituent elements. In response to demands from the market such as downsizing and increasing the number of pixels, the pixel pitch has been made smaller year by year. However, in a CMOS sensor in which the pixel is constituted by a large number of transistors, there is a problem in that, due to miniaturization, the opening ratio of the PD decreases and the sensitivity decreases.

Therefore, a technique in which the floating diffusion (FD) of the TXs that transfer charges from the respective two PDs of two adjacent pixels and the RST connected to this FD are shared in order to increase the opening ratio of the PD is described in Japanese Patent No. 3,031,606. In this case, the distances from the respective TXs to the center of the FD are the same with respect to the two pixels.

However, when the sharing method described in Japanese Patent No. 3,031,606 is extended so as to be applied to the PDs of three or more pixels that are arranged one-dimensionally, the distances from the respective TXs to the center of the FD cannot be made the same. Therefore, the distribution of potential in a region from the TX on the upstream side of the flow (path) of charge transfer to the center of the FD differs, and the transfer degree is affected. As a result, the variation in characteristics between pixels may be affected. That is, in the case where an output portion of the PDs of three or more pixels that are arranged one-dimensionally is shared by the pixels, a problem arises in that distances between the respective TXs to the center of the FD differ, and in such a case, variation in characteristics between pixels may occur.

SUMMARY

Some aspects of the invention relate to a solid-state imaging device in which, even if an output portion of photodiodes is shared by three or more pixels that are arrayed one-dimensionally, the sameness of potential distributions in the pixels, in a region from a photodiode of a transfer transistor on the upstream side of the charge transfer path to the floating diffusion, is improved.

In a first aspect of the invention, a solid-state imaging device includes: a first transfer transistor including a first photodiode, a first gate electrode, and a first diffusion layer; a second transfer transistor including a second photodiode, a second gate electrode, and a second diffusion layer; a third transfer transistor including a third photodiode, a third gate electrode, and a third diffusion layer; and a reset transistor including a fourth diffusion layer and a fourth gate electrode. The first diffusion layer, the second diffusion layer, the third diffusion layer, and the fourth diffusion layer are separated from each other. The first diffusion layer, the second diffusion layer, the third diffusion layer, and the fourth diffusion layer are electrically connected to each other via an interconnect. The first photodiode, the second photodiode, and the third photodiode are arrayed one-dimensionally.

According to the first aspect of the invention, the first to fourth diffusion layers are arranged so as to be separated from each other, and the first to fourth diffusion layers are electrically connected via an interconnect. Therefore, even if an output portion is shared by the photodiodes that are arrayed one-dimensionally, the sameness of the potential distributions in the pixels, in a region from the photodiode of the transfer transistor on the upstream side of the charge transfer path to the diffusion layer, can be improved.

In a second aspect of the invention, the first diffusion layer, the second diffusion layer, and the third diffusion layer may have approximately the same shape and area, in the first aspect of the invention. Accordingly, the sameness of the potential distributions in the pixels, in a region from the photodiode of the transfer transistor on the upstream side of the charge transfer path to the diffusion layer, can be further improved.

In a third aspect of the invention, in plan view, a distance from an end portion of the first gate electrode on the first photodiode side to a center of the first diffusion layer, a distance from an end portion of the second gate electrode on the second photodiode side to a center of the second diffusion layer, and a distance from an end portion of the third gate electrode on the third photodiode side to a center of the third diffusion layer may be approximately the same, in the first or second aspect of the invention. Accordingly, the sameness of the potential distributions in the pixels, in a region from the photodiode of the transfer transistor on the upstream side of the charge transfer path to the diffusion layer, can be further improved.

In a fourth aspect of the invention, a solid-state imaging device includes: a first transfer transistor including a first photodiode, a first gate electrode, and a first diffusion layer; a second transfer transistor including a second photodiode, a second gate electrode, and the first diffusion layer; a third transfer transistor including a third photodiode, a third gate electrode, and a second diffusion layer; and a reset transistor including a third diffusion layer and a fourth gate electrode. The first diffusion layer, the second diffusion layer, and the third diffusion layer are separated from each other. The first diffusion layer, the second diffusion layer, and the third diffusion layer are electrically connected to each other via an interconnect. The first photodiode, the second photodiode, and the third photodiode are arrayed one-dimensionally.

According to the fourth aspect of the invention, the first to third diffusion layers are arranged so as to be separated from each other, and the first to third diffusion layers are electrically connected via an interconnect. Therefore, even if an output portion is shared by the photodiodes that are arrayed one-dimensionally, the sameness of the potential distributions in the pixels, in a region from the photodiode of the transfer transistor on the upstream side of the charge transfer path to the diffusion layer, can be improved.

In a fifth aspect of the invention, the first diffusion layer and the second diffusion layer may have approximately the same shape and area, in the fourth aspect of the invention. Accordingly, the sameness of the potential distributions in the pixels, in a region from the photodiode of the transfer transistor on the upstream side of the charge transfer path to the diffusion layer, can be further improved.

In a sixth aspect of the invention, a fourth transfer transistor including a fourth photodiode, a fourth gate electrode, and the second diffusion layer is further included, in the fourth or fifth aspect of the invention. The first photodiode, the second photodiode, the third photodiode, and the fourth photodiode may be arrayed one-dimensionally.

In a seventh aspect of the invention, in plan view, a distance from an end portion of the first gate electrode on the first photodiode side to a center of the first diffusion layer, a distance from an end portion of the second gate electrode on the second photodiode side to the center of the first diffusion layer, a distance from an end portion of the third gate electrode on the third photodiode side to a center of the second diffusion layer may be approximately the same, in any one of the fourth to sixth aspects of the invention. Accordingly, the sameness of the potential distributions in the pixels, in a region from the photodiode of the transfer transistor on the upstream side of the charge transfer path to the diffusion layer, can be further improved.

In an eighth aspect of the invention, in plan view, a distance from an end portion of the first gate electrode on the first photodiode side to a center of the first diffusion layer, a distance from an end portion of the second gate electrode on the second photodiode side to the center of the first diffusion layer, a distance from an end portion of the third gate electrode on the third photodiode side to a center of the second diffusion layer, and a distance from an end portion of the fourth gate electrode on the fourth photodiode side to the center of the second diffusion layer may be the same, in the sixth aspect of the invention. Accordingly, the sameness of the potential distributions in the pixels, in a region from the photodiode of the transfer transistor on the upstream side of the charge transfer path to the diffusion layer, can be further improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. However, the invention is not limited to the following description, and it can be easily understood by a person skilled in the art that various changes may be made to the form and the details of the invention without departing from the spirit and scope of the invention. Therefore, the invention is not to be construed as being limited to the following description of the embodiments.

Embodiment 1

Figure 1:
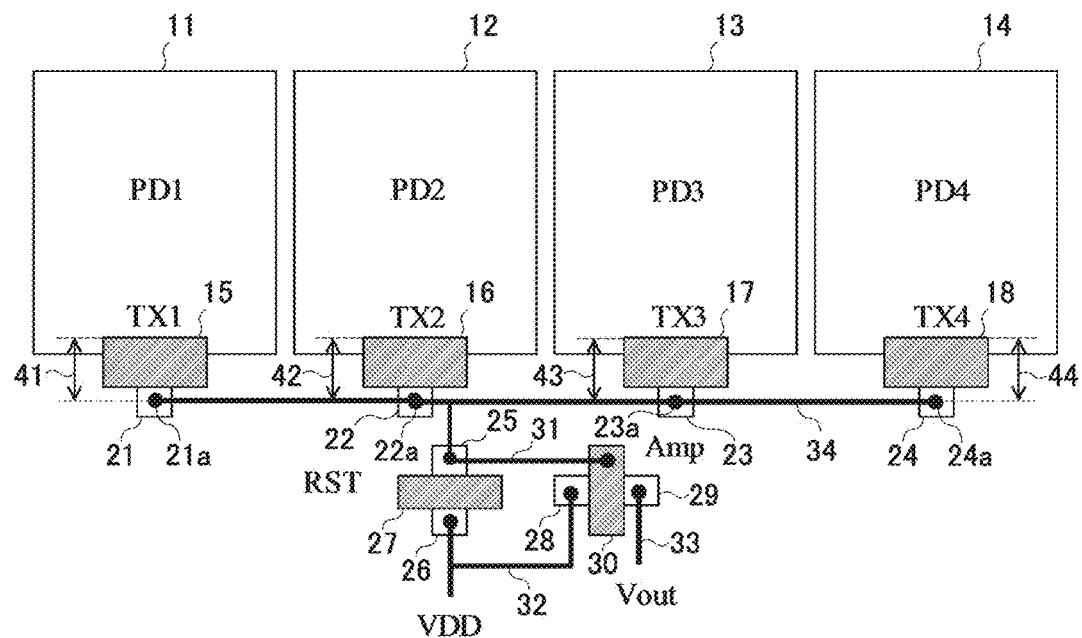
FIG. 1 is a plan view schematically illustrating a solid-state imaging device according to one aspect of the invention.

FIG. 1 is a plan view schematically illustrating a solid-state imaging device according to one aspect of the invention. The solid-state imaging device includes a first photodiode (PD1) 11, a second photodiode (PD2) 12, a third photodiode (PD3) 13, and a fourth photodiode (PD4) 14 that are arrayed one-dimensionally.

Also, the solid-state imaging device includes first to fourth transfer transistors TX1, TX2, TX3, and TX4, a reset transistor RST, and an amplification transistor Amp.

The first transfer transistor TX1 is constituted by the first photodiode 11, a first transfer gate (also referred to as first gate electrode) 15, and a first floating diffusion (also referred to as first diffusion layer) 21.

The second transfer transistor TX2 is constituted by the second photodiode 12, a second transfer gate (also referred to as second gate electrode) 16, and a second floating diffusion (also referred to as second diffusion layer) 22.

The third transfer transistor TX3 is constituted by the third photodiode 13, a third transfer gate (also referred to as third gate electrode) 17, and a third floating diffusion (also referred to as third diffusion layer) 23.

The fourth transfer transistor TX4 is constituted by the fourth photodiode 14, a fourth transfer gate 18, and a fourth floating diffusion 24.

Note that, in the present embodiment, a solid-state imaging device including four photodiodes will be described, but the solid-state imaging device need only include at least three photodiodes, and may be a solid-state imaging device including five or more photodiodes. In the case of the solid-state imaging device including three photodiodes, the configuration may be such that the fourth photodiode and fourth transfer transistor constituted by the fourth photodiode in FIG. 1 are omitted, and in the case of the solid-state imaging device including five or more photodiodes, a fifth and following photodiodes and transfer transistors constituted by the fifth photodiode are similarly arrayed one-dimensionally adjacent to the fourth photodiode and the fourth transfer transistor constituted by the fourth photodiode, respectively, in FIG. 1.

The first floating diffusion 21, the second floating diffusion 22, the third floating diffusion 23, and the fourth floating diffusion 24 each have substantially the same shape and area. "Each having substantially the same shape and area" mentioned here means that in the case where the first to fourth floating diffusions 21 to 24 are set to have a predetermined shape and area, the actual shape and area of each of the first to fourth floating diffusions 21 to 24 fall in a range of ±10% of the predetermined shape and area.

Also, a first distance 41, a second distance 42, a third distance 43, and a fourth distance 44 are substantially the same in plan view. "A first distance 41, a second distance 42, a third distance 43, and a fourth distance 44 are substantially the same" mentioned here means that in the case of setting the first to fourth distances 41 to 44 to a predetermined distance, the actual first to fourth distances 41 to 44 fall in a range of ±10% of the predetermined distance.

The first distance 41 is a distance from an end portion of the first transfer gate 15 on the first photodiode 11 side to a center 21a of the first floating diffusion 21. The second distance 42 is a distance from an end portion of the second transfer gate 16 on the second photodiode 12 side to a center 22a of the second floating diffusion 22. The third distance 43 is a distance from an end portion of the third transfer gate 17 on the third photodiode 13 side to a center 23a of the third floating diffusion 23. The fourth distance 44 is a distance from an end portion of the fourth transfer gate 18 on the fourth photodiode 14 side to a center 24a of the fourth floating diffusion 24.

The reset transistor RST is constituted by a diffusion layer (also referred to as fourth diffusion layer) 25, which is a source or drain region, a reset gate (also referred to as fourth gate electrode) 27, and a diffusion layer 26, which is a drain or source region.

The first floating diffusion (first FD) 21, the second floating diffusion (second FD) 22, the third floating diffusion (third FD) 23, the fourth floating diffusion (fourth FD) 24, and the diffusion layer 25, which is a source or drain region, are separated from each other. Also, the first FD 21, the second FD 22, the third FD 23, the fourth FD 24, and the diffusion layer 25, which is a source or drain region, are electrically connected to each other via an interconnect 34.

The amplification transistor Amp is constituted by a diffusion layer 28, which is a source or drain region, an amplification gate 30, and a diffusion layer 29, which is a drain or source region. The diffusion layer 25, which is a source or drain region, of the reset transistor RST is electrically connected to the amplification gate 30 via the interconnect 31. The diffusion layer 28, which is a source or drain region of the amplification transistor Amp, is electrically connected to the diffusion layer 26, which is a drain or source region of the RST, and a VDD via an interconnect 32. The diffusion layer 29, which is a drain or a source region of the amplification transistor Amp, is electrically connected to a Vout via an interconnect 33.

According to the present embodiment, the first to fourth FDs 21, 22, 23, and 24 and the diffusion layer 25, which is a source or drain region, are arranged so as to be separated from each other, and the first to fourth FDs 21 to 24 and the diffusion layer 25, which is a source or drain region, are connected to each other via the interconnect 34. Therefore, even if the output portion of photodiodes of three or more pixels that are arrayed one-dimensionally is shared by the pixels, the sameness of the potential distributions in the pixels, in a region from the photodiode of the transfer transistor on the upstream side of the charge transfer path to the floating diffusion, can be improved. That is, the potential distribution in a region from the photodiode of the transfer transistor to the floating diffusion does not differ depending on the photodiode of a pixel, and as a result, the variation in characteristics between pixels can be suppressed.

Also, in the present embodiment, as a result of making the first FD 21, the second FD 22, the third FD 23, and the fourth FD 24 to have approximately the same shape and size, the sameness of the potential distributions in the pixels, in a region from the photodiode of the transfer transistor on the upstream side of the charge transfer path to the floating diffusion, can be further improved. As a result, the variation in characteristics between pixels can be further suppressed.

Also, in the present embodiment, as a result of making the first distance 41, the second distance 42, the third distance 43, and the fourth distance 44 approximately the same in plan view, the sameness of the potential distributions in the pixels, in a region from the photodiode of the transfer transistor on the upstream side of the charge transfer path to the floating diffusion, can be further improved. As a result, the variation in characteristic between pixels can be further suppressed.

Figure 2A:
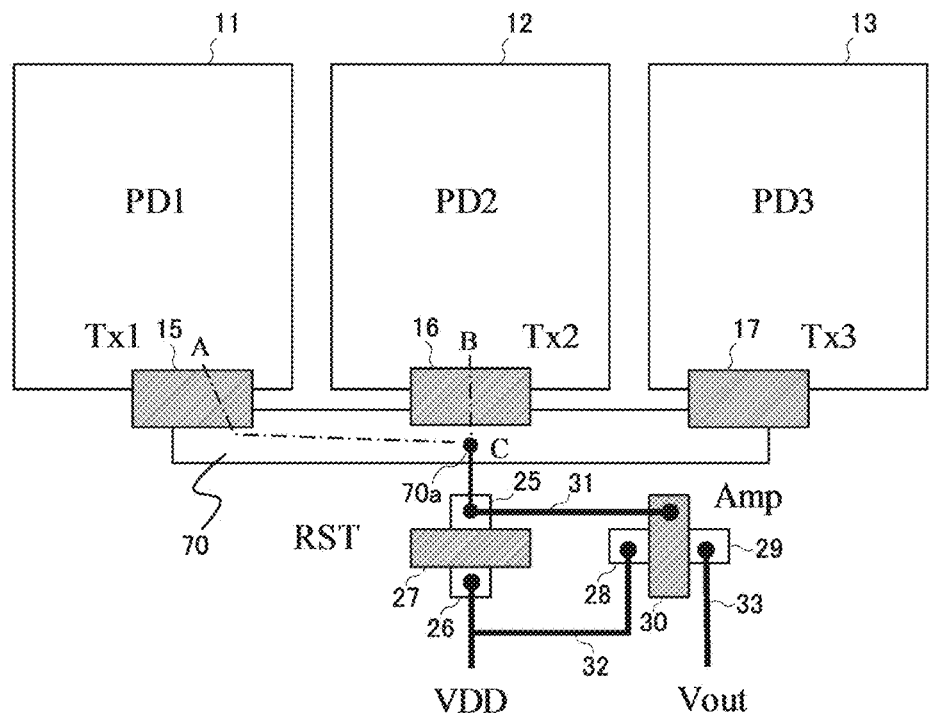
FIG. 2A is a plan view schematically illustrating a solid-state imaging device serving as a comparative example.
Figures 2B, 2C:
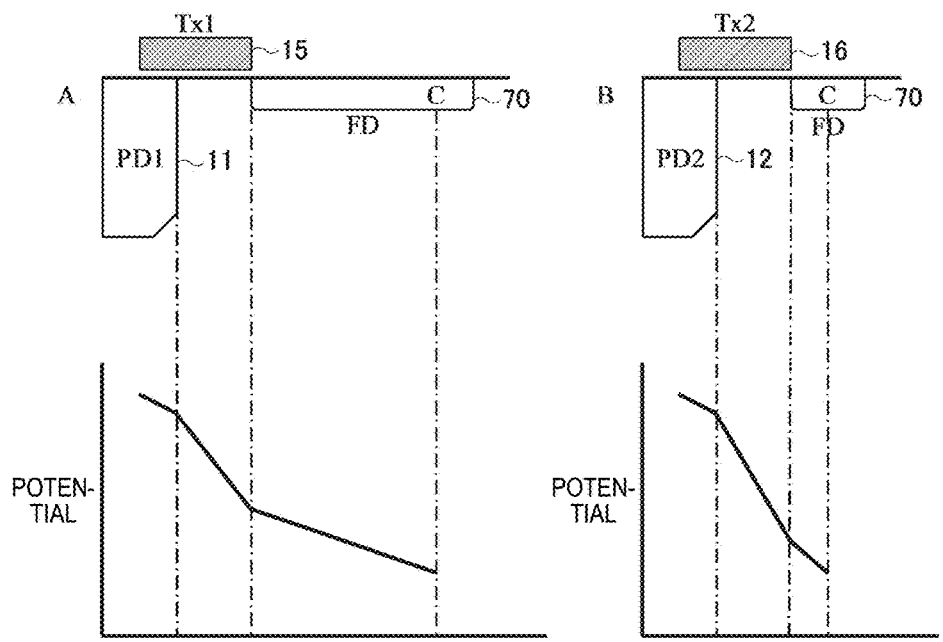
FIG. 2B is a potential distribution diagram in a region between A and C shown in FIG. 2A.
FIG. 2C is a potential distribution diagram in a region between B and C shown in FIG. 2A.

Next, a comparative example in which floating diffusions (FD) 70 are not arranged separately will be described with reference to FIG. 2. FIG. 2A is a plan view schematically illustrating a solid-state imaging device serving as the comparative example. FIG. 2B is a diagram illustrating a potential distribution in a region between A and C shown in FIG. 2A. FIG. 2C is a diagram illustrating a potential distribution in a region between B and C shown in FIG. 2A.

The solid-state imaging device shown in FIG. 2 is different from the solid-state imaging device shown in FIG. 1 in that the fourth photodiode 14 and the fourth transfer transistor TX4 are not included and the FDs 70 are not arranged separately.

A point in the FD 70 having the lowest potential is a point C that is a geometric center 70a. In a sense in which, in the case where the diffusion layer 25, which is a source or a drain region, of the reset transistor RST and the FD 70 are electrically connected by an interconnect, the point C is a place in which a contact to the FD 70 is arranged, the point C is a point having the lowest potential. A path through which charges pass from the first photodiode 11 side of the first transfer transistor Tx1 to the FD 70 is routed from A to C, and a path through which charges pass from the second photodiode 12 side of the second transfer transistor Tx2 to the FD 70 is routed from B to C. Therefore, the path length (distance) between A to C differs from the path length between B to C, unless the floating diffusions (FD) 70 are arranged separately as the solid-state imaging device shown in FIG. 1.

That is, the path length between A and C, that is, the path length from the end portion A of the first transfer gate 15 on the first photodiode 11 side to the point C that is the center 70a of the FD 70 is longer than the path length between B and C, that is, the path length from the end portion B of the second transfer gate 16 on the second photodiode 12 side to the point C that is the center 70a of the FD 70. Therefore, as shown in FIGS. 2B and 2C, the potential slope is gentle in a portion from A to C, and is steep in a portion from B to C. As a result, the sameness of the potential distributions in the pixels, in a region from the photodiode of the transfer transistor to the FD 70 in a charge transfer path, decreases. As a result, the difference in characteristics between pixels increases. In contrast, in the solid-state imaging device shown in FIG. 1, the sameness of potential distributions in the pixels, in a region from the photodiode of the transfer transistor in the charge transfer path to the floating diffusion, is improved, and as a result, the difference in characteristics between pixels can be suppressed.

Embodiment 2

Figure 3:
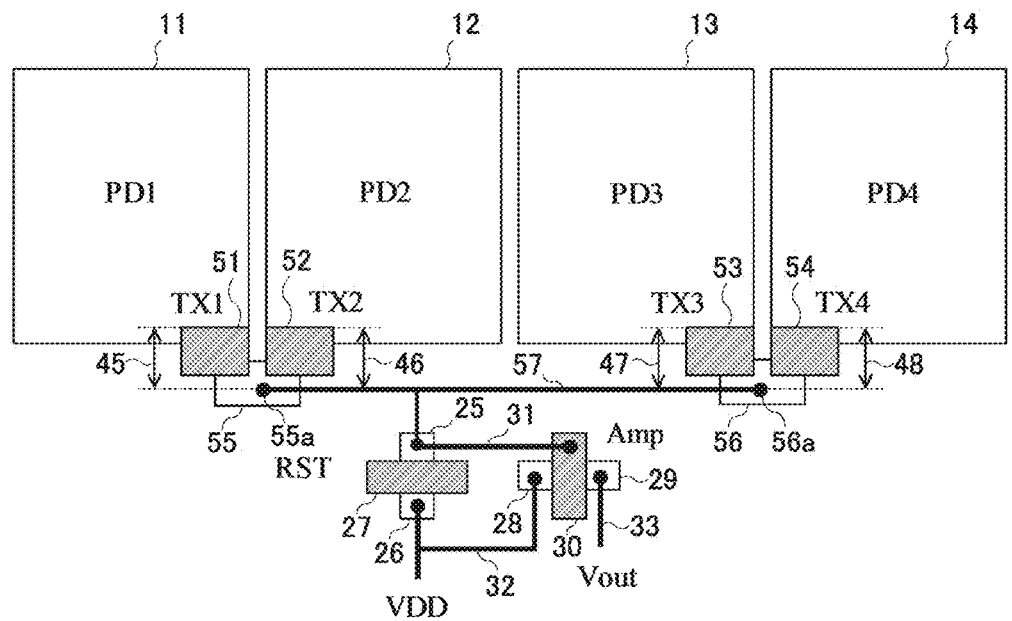
FIG. 3 is a plan view schematically illustrating a solid-state imaging device according to one aspect of the invention.

FIG. 3 is a plan view schematically illustrating a solid-state imaging device according to one aspect of the invention, and portions that are similar to those in FIG. 1 are given the same reference signs, and descriptions thereof will be omitted.

A first transfer transistor TX1 is constituted by a first photodiode 11, a first transfer gate (also referred to as first gate electrode) 51, and a first floating diffusion (also referred to as first diffusion layer) 55.

A second transfer transistor TX2 is constituted by a second photodiode 12, a second transfer gate (also referred to as second gate electrode) 52, and the first floating diffusion 55.

A third transfer transistor TX3 is constituted by a third photodiode 13, a third transfer gate (also referred to as third gate electrode) 53, and a second floating diffusion (also referred to as second diffusion layer) 56.

A fourth transfer transistor TX4 is constituted by a fourth photodiode 14, a fourth transfer gate 54, and the second floating diffusion 56.

Note that, in the present embodiment, a solid-state imaging device including four photodiodes will be described, but the solid-state imaging device need only include at least three photodiodes, and may be a solid-state imaging device including five or more photodiodes. In the case of the solid-state imaging device including three photodiodes, the configuration may be such that the fourth photodiode 14 and fourth transfer gate 54 in FIG. 3 are omitted, and in the case of the solid-state imaging device including five or more photodiodes, a fifth and following photodiodes and transfer transistors are similarly arrayed one-dimensionally adjacent to the fourth photodiode 14 and the fourth transfer transistor, respectively, in FIG. 3.

The first floating diffusion (first FD) 55 and the second floating diffusion (second FD) 56 each have substantially the same shape and area. "Each having substantially the same shape and area" mentioned here means that in the case where the first and second FDs 55 and 56 are set to have a predetermined shape and area, the actual shape and area of each of the first and second FDs 55 and 56 fall in a range of ±10% of the predetermined shape and area.

Also, a first distance 45, a second distance 46, a third distance 47, and a fourth distance 48 are substantially the same in plan view. "A first distance 45, a second distance 46, a third distance 47, and a fourth distance 48 are substantially the same" mentioned here means that in the case of setting the first to fourth distances 45 to 48 to a predetermined distance, the actual first to fourth distances 45 to 48 fall in a range of ±10% of the predetermined distance.

The first distance 45 is a distance from an end portion of the first transfer gate 51 on the first photodiode 11 side to a center 55a of the first FD 55. The second distance 46 is a distance from an end portion of the second transfer gate 52 on the second photodiode 12 side to the center 55a of the first FD 55. The third distance 47 is a distance from an end portion of the third transfer gate 53 on the third photodiode 13 side to a center 56a of the second FD 56. The fourth distance 48 is a distance from an end portion of the fourth transfer gate 54 on the fourth photodiode 14 side to the center 56a of the second FD 56.

The first FD 55, the second FD 56, and the diffusion layer 25, which is a source or drain region, are separated from each other. Also, the first FD 55, the second FD 56, and the diffusion layer 25, which is a source or drain region, are electrically connected to each other via an interconnect 57.

According to the present embodiment, the first and second FDs 55 and 56 and the diffusion layer 25, which is a source or a drain region, are arranged so as to be separated from each other, and the first and second FDs 55 and 56 and the diffusion layer 25, which is a source or a drain region, are connected to each other via the interconnect 57. Therefore, even if the output portion of photodiodes of three or more pixels that are arrayed one-dimensionally is shared by the pixels, the sameness of the potential distributions in the pixels, in a region from the photodiode of the transfer transistor on the upstream side of the charge transfer path to the floating diffusion, can be improved. That is, the potential distribution in a region from the photodiode of the transfer transistor to the floating diffusion does not differ depending on the photodiode of a pixel, and as a result, the variation in characteristics between pixels can be suppressed.

Also, in the present embodiment, as a result of making the first FD 55 and the second FD 56 to have approximately the same shape and size, the sameness of the potential distributions in the pixels, in a region from the photodiode of the transfer transistor on the upstream side of the charge transfer path to the floating diffusion, can be further improved. As a result, the variation in characteristics between pixels can be further suppressed.

Also, in the present embodiment, as a result of making the first distance 45, the second distance 46, the third distance 47, and the fourth distance 48 approximately the same in plan view, the sameness of the potential distributions in the pixels, in a region from the photodiode of the transfer transistor on the upstream side of the charge transfer path to the floating diffusion, can be further improved. As a result, the variation in characteristics between pixels can be further suppressed.

Also, Embodiments 1 and 2 described above may be appropriately combined for implementation.

The entire disclosure of Japanese Patent Application No. 2016-94610, filed May 10, 2016 is expressly incorporated by reference herein.

What is claimed is:

1. A solid-state imaging device comprising:
   a first transfer transistor including a first photodiode, a first gate electrode, and a first diffusion layer;
   a second transfer transistor including a second photodiode, a second gate electrode, and a second diffusion layer;
   a third transfer transistor including a third photodiode, a third gate electrode, and a third diffusion layer;
   a reset transistor including a fourth diffusion layer and a fourth gate electrode; and
   an amplification transistor including an amplification gate,
   wherein the first diffusion layer, the second diffusion layer, the third diffusion layer, and the fourth diffusion layer are separated from each other,
   the first diffusion layer, the second diffusion layer, the third diffusion layer, and the fourth diffusion layer are electrically connected to each other via an interconnect,
   the first photodiode, the second photodiode, and the third photodiode are arrayed one-dimensionally,
   each of the first, second and third gate electrodes is positioned along and parallel to a side edge of its respective photodiode, and
   in plan view, the amplification gate is oriented perpendicular to the fourth gate electrode of the reset transistor.

2. The solid-state imaging device according to claim 1, wherein the first diffusion layer, the second diffusion layer, and the third diffusion layer have approximately the same shape and area.

3. The solid-state imaging device according to claim 1, wherein, in plan view, a distance from an end portion of the first gate electrode on the first photodiode side to a center of the first diffusion layer, a distance from an end portion of the second gate electrode on the second photodiode side to a center of the second diffusion layer, and a distance from an end portion of the third gate electrode on the third photodiode side to a center of the third diffusion layer are approximately the same.

4. The solid-state imaging device according to claim 1, wherein
   the interconnect is oriented perpendicular to the amplification transistor amplification gate.

5. The solid-state imaging device according to claim 1, wherein
   the interconnect is oriented parallel to the reset transistor gate electrode, the first gate electrode, the second gate electrode, and the third gate electrode.

6. A solid-state imaging device comprising:
   a first transfer transistor including a first photodiode, a first gate electrode, and a first diffusion layer;
   a second transfer transistor including a second photodiode, a second gate electrode, and the first diffusion layer;
   a third transfer transistor including a third photodiode, a third gate electrode, and a second diffusion layer;

a reset transistor including a third diffusion layer and a fourth gate electrode; and an amplification transistor including an amplification gate, wherein the first diffusion layer, the second diffusion layer, and the third diffusion layer are separated from each other, the first diffusion layer, the second diffusion layer, and the third diffusion layer are electrically connected to each other via an interconnect, the first photodiode, the second photodiode, and the third photodiode are arrayed one-dimensionally, and in plan view, the amplification gate is oriented perpendicular to the fourth gate electrode of the reset transistor.

7. The solid-state imaging device according to claim 6, wherein the first diffusion layer and the second diffusion layer have approximately the same shape and area.

8. The solid-state imaging device according to claim 6, further comprising a fourth transfer transistor including a fourth photodiode, a fourth gate electrode, and the second diffusion layer, wherein the first photodiode, the second photodiode, the third photodiode, and the fourth photodiode are arrayed one-dimensionally.

9. The solid-state imaging device according to claim 8, wherein, in plan view, a distance from an end portion of the first gate electrode on the first photodiode side to a center of the first diffusion layer, a distance from an end portion of the second gate electrode on the second photodiode side to the center of the first diffusion layer, a distance from an end portion of the third gate electrode on the third photodiode side to a center of the second diffusion layer, and a distance from an end portion of the fourth gate electrode on the fourth photodiode side to the center of the second diffusion layer are approximately the same.

10. The solid-state imaging device according to claim 6, wherein, in plan view, a distance from an end portion of the first gate electrode on the first photodiode side to a center of the first diffusion layer, a distance from an end portion of the second gate electrode on the second photodiode side to the center of the first diffusion layer, and a distance from an end portion of the third gate electrode on the third photodiode side to a center of the second diffusion layer are approximately the same.

11. The solid-state imaging device according to claim 6, wherein the first photodiode has a first side adjacent a first side of the second photodiode, and a second side perpendicular to the first side of the first photodiode;

the second photodiode has a second side perpendicular to the first side of the second diode;

the first diffusion layer extends along the second side of the first diode and the second side of the second diode;

the first gate electrode is positioned on the second side of the first diode; and the second gate electrode is positioned on the second side of the second diode.

12. A solid-state imaging device comprising:

a first pixel having a first photodiode and a first transfer transistor, the first photodiode generating charge in response to received light, the first transfer transistor having a first gate electrode, and a first diffusion layer;

a second pixel having a second photodiode and a second transfer transistor, the second photodiode generating charge in response to received light, the second transfer transistor having a second gate electrode, and a second diffusion layer;

a third pixel having a third photodiode and a third transfer transistor, the third photodiode generating charge in response to received light, the third transfer transistor having a third gate electrode, and a third diffusion layer;

a reset transistor including a fourth diffusion layer and a fourth gate electrode; and an amplification transistor including an amplification gate, wherein the first diffusion layer, the second diffusion layer, the third diffusion layer, and the fourth diffusion layer are separated from each other, the first diffusion layer, the second diffusion layer, the third diffusion layer, and the fourth diffusion layer are electrically connected to each other via an interconnect, the first photodiode, the second photodiode, and the third photodiode are arrayed one-dimensionally, and in plan view, the amplification gate is oriented perpendicular to the fourth gate electrode of the reset transistor.

* * * * *